United States Patent
Hong (10) Patent No.: US 6,281,544 B1
(45) Date of Patent: Aug. 28, 2001

(54) FLASH MEMORY STRUCTURE AND METHOD OF MANUFACTURE

(75) Inventor: Gary Hong, Hsin-Chu (TW)

(73) Assignee: United Microelectronics, Corp., Hsinchu (TW)

(*) Notice: Subject to any disclaimer, the term of this patent is extended or adjusted under 35 U.S.C. 154(b) by 0 days.

(21) Appl. No.: 09/521,984

(22) Filed: Mar. 9, 2000

Related U.S. Application Data

(62) Division of application No. 09/186,748, filed on Nov. 5, 1998.

(30) Foreign Application Priority Data

Aug. 4, 1998 (TW) ................................. 87112801

(51) Int. Cl.$^7$ .......................... H01L 29/76; H01L 29/788
(52) U.S. Cl. ........................ 257/314; 257/315; 257/316; 257/317; 257/320; 257/321
(58) Field of Search ................. 257/314–317, 257/320, 321; 438/257, 262

(56) References Cited

U.S. PATENT DOCUMENTS

| | | | |
|---|---|---|---|
| 5,523,249 | * 6/1996 | Gill et al. | 438/263 |
| 5,547,884 | * 8/1996 | Yamaguchi et al. | 438/297 |
| 5,553,018 | * 9/1996 | Wang et al. | 257/314 |
| 5,652,447 | * 7/1997 | Chen et al. | 257/315 |
| 5,962,890 | * 10/1999 | Sato | 257/320 |

* cited by examiner

Primary Examiner—Sara Crane
Assistant Examiner—Thien F. Tran
(74) Attorney, Agent, or Firm—Jiawei Huang; J.C. Patents (57) ABSTRACT

A flash memory structure comprises a first polysilicon layer above a semiconductor substrate; a thin dielectric layer above the first polysilicon layer; and a second polysilicon layer across and above the dielectric layer and the substrate, wherein the second polysilicon layer has a linear shape when viewed from the top. The memory structure further comprises a drain region in the semiconductor substrate on one side of the second polysilicon layer; a trench isolation structure for insulating from neighboring devices; a buried metallic layer located inside a portion of the trench isolation structure close to the upper surface of the substrate; and a common source region located on the other side of the first polysilicon layer just opposite the drain region such that the common source region at least includes a source region and a buried metallic layer alternately linked together.

12 Claims, 7 Drawing Sheets

FLASH MEMORY STRUCTURE AND METHOD OF MANUFACTURE

CROSS-REFERENCE TO RELATED APPLICATION

This application is a divisional application of, and claims the priority benefit of, U.S. application Ser. No. 09/186,748 filed on Nov. 5, 1998 which claims the priority benefit of Taiwan application serial No. 87112801, filed on Aug. 4, 1998.

BACKGROUND OF THE INVENTION

1. Field of Invention

The present invention relates to a flash memory structure and its method of manufacture. More particularly, the present invention relates to a flash memory structure having a common source terminal made from a buried metal layer, whose method of manufacture is also suitable for producing a shallow trench isolation (STI) structure.

2. Description of Related Art

Conventional flash memory is a type of erasable programmable read-only memory (EPROM). There have been many articles written about flash memories. In general, the gate of a flash memory includes a polysilicon floating gate, which is used for storing electric charges, and a control gate, which is used for controlling data access. Therefore, EPROM normally has two gate terminals with the floating gate located below the control gate. The control gate and the word line are usually connected, and the floating gate is usually in a "floating" state. In other words, the floating gate is not in contact with any other circuits. An outstanding property of flash memory is its ability to perform a fast, block-by-block memory erase instead of the slow, bit-by-bit memory erase as in conventional EPROMs. Consequently, operation speed of a flash memory is very fast. Often, the entire memory can be erased within one or two seconds.

Figure 1:
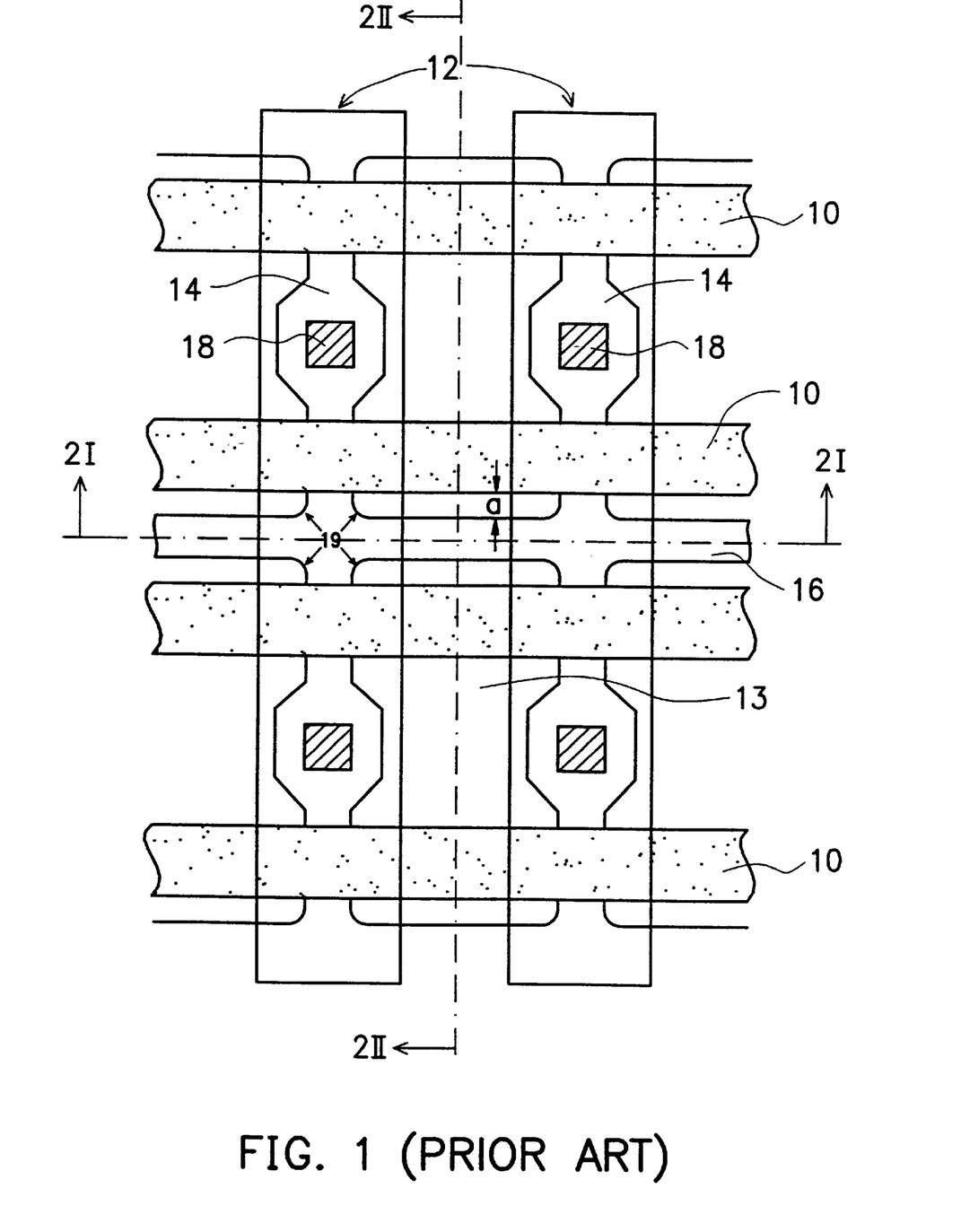
FIG. 1 is the top view of a conventional flash memory structure.

FIG. 1 is the top view of a conventional flash memory structure. In FIG. 1, the control gate 10 is used as a word line. The metallic bit line 12 and the control gate 10 run across each other perpendicularly. On each side of the control gate 10, a drain region 14 and a common source 16 are present. There is a contact window 18 above the drain region 14 for coupling electrically with the bit line 12. Furthermore, field oxide layers 13 surround the aforementioned device for insulation.

Figure 2A:
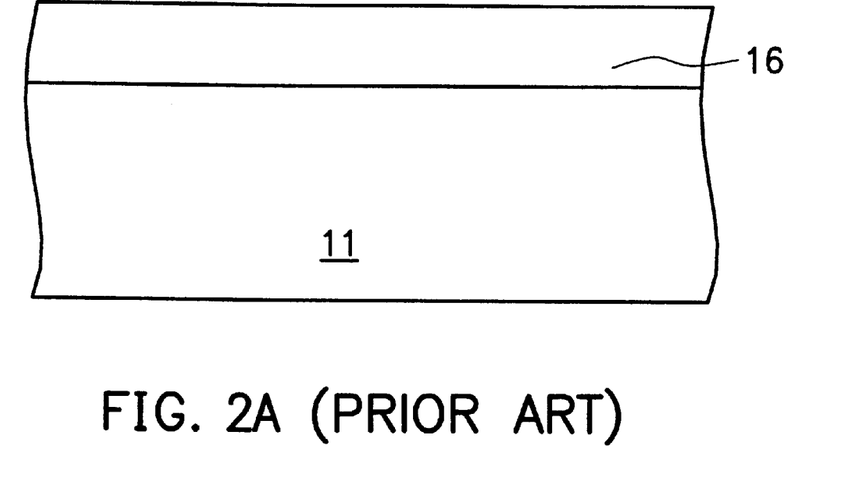
FIG. 2A is a cross-sectional view taken along line 2I—2I of FIG. 1 that shows a conventional flash memory structure.
Figure 2B:
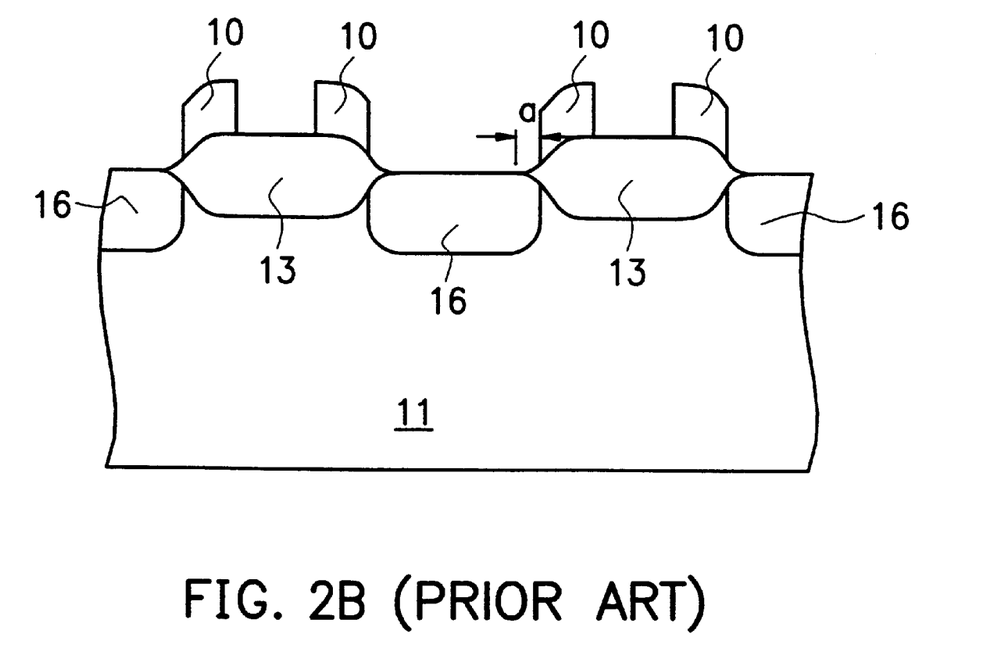
FIG. 2B is a cross-sectional view taken along line 2II—2II of FIG. 1.

FIG. 2A is a cross-sectional view taken along line 2I—2I of FIG. 1 that shows a conventional flash memory structure. FIG. 2B is a cross-sectional view taken along line 2II—2II of FIG. 1. First, as shown in FIG. 2A, a common source region 16 is formed within a semiconductor substrate 11. Next, as shown in FIG. 2B, the common source region 16 is isolated by field oxide layers 13, and then control gates 10 are formed above the field oxide layers 13. The control gates 10 can be made from, for example, polysilicon. In order to avoid leakage current or other short-circuit conditions, a minimum distance "a" must be allowed between the control gate 10 and the common source region 16 as shown in FIG. 2B.

In general, this type of flash memory structure has several defects. Firstly, the field oxide insulation structure will produce a rounded corner structure 19 in the common source region 16 close to the control gate 10 when viewed from above (as shown in FIG. 1). Secondly, the field oxide layer in this region has a lateral extension known commonly as the bird's beak as shown in FIG. 2B. Therefore, extra space "a" (as shown in FIG. 1) between the control gate 10 and the common source region 16 must be set aside to prevent unwanted leakage current and short-circuiting.

In general, most integrated circuits must have some form of insulation for isolating one device from its close neighbors. Field oxide layers used to be one of the most commonly used isolating structure. However, the field oxide layer is gradually being replaced by shallow trench isolation (STI) structures. At present, most flash memory structure uses shallow trench isolation. This is because STI has better structural properties than conventional field oxide structure, and furthermore can save chip area. Normally, shallow trench isolation is formed by first performing an anisotropic dry etching operation to form a trench in a substrate, and then depositing some oxide material into the trench.

However, when shallow trench isolation is applied to the fabrication of flash memory structure, area occupied by each device is still large. Moreover, if the common source region and the gate structure are too close together, and the gate oxide layer is too thin, problems such as leakage current or unwanted short-circuiting still have to be dealt with.

In light of the foregoing, there is a need to improve the flash memory structure and method of manufacture.

SUMMARY OF THE INVENTION

Accordingly, the present invention provides a flash memory structure and its method of manufacture. The structure includes a buried metal layer that can save device area and is capable of providing higher density for a device array. Moreover, processing steps necessary for forming the structure are simple, and a shallow trench isolation structure can be easily manufactured as well. In addition, the common source also has a flatter cross section and a better alignment.

To achieve these and other advantages and in accordance with the purpose of the invention, as embodied and broadly described herein, the invention provides a method of manufacturing flash memory. The method comprises the steps of first providing a semiconductor substrate, and then forming a shallow trench isolation structure within the substrate. Next, the shallow trench isolation structure is etched to form a shallow trench. The shallow trench is formed in the desired common source regions. Moreover, the shallow trench isolation structure has a greater depth than the shallow trench. Thereafter, metallic material is deposited into the trench, and then the metallic layer is polished to a level roughly the same as the upper surface of the semiconductor substrate. Hence, a buried metallic layer is formed. Subsequently, a polysilicon layer is formed over the substrate, and then the polysilicon layer is patterned. Then, ions are implanted into the substrate on each side of the polysilicon layer using the polysilicon layer as a mask to form a source region and a drain region, respectively. The source region and the buried metallic layer alternately connect with each other to form a common source region. Finally, metallic interconnects are formed above the polysilicon layer.

In another aspect, this invention provides a flash memory structure. The structure comprises a semiconductor substrate, a linear polysilicon layer running across above the semiconductor substrate, a drain region in the substrate on one side of the polysilicon layer, a trench isolation structure above the substrate for insulating devices, a buried metallic layer within the substrate such that the buried metallic layer overlaps with a portion of the trench isolation structure, and a common source region within the substrate located on the other side of the polysilicon layer just opposite the drain region such that the common source region is made up of at least a source region and a buried metallic layer connected together.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In this invention, a flash memory structure and its method of manufacture is provided. One major aspect of this invention is the formation of a buried metal layer in the common source structure so that area occupied by each device can be reduced and density of device array can be greatly increased. Moreover, processing steps necessary for forming the flash memory structure are quite simple, and are quite suitable for fabricating shallow trench isolation (STI) structure. Furthermore, the common source terminal has a flatter cross-sectional profile and a better alignment. In addition, bird's beak and rounded corners normally associated with the formation of a field oxide layer can be prevented.

Figure 3:
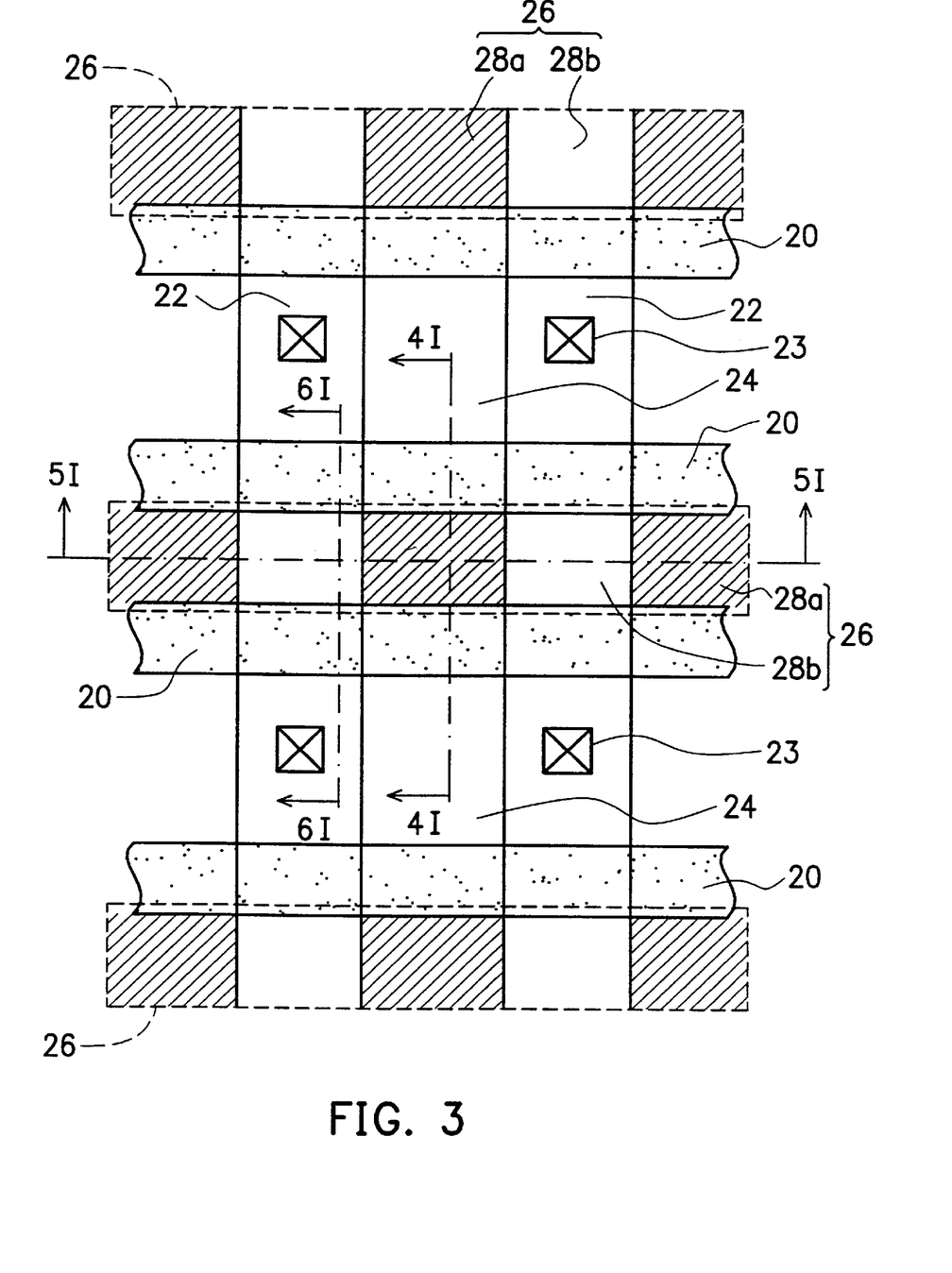
FIG. 3 is the top view of a flash memory structure fabricated according to one preferred embodiment of this invention.

FIG. 3 is the top view of a flash memory structure fabricated according to one preferred embodiment of this invention. In FIG. 3, control gates 20 serve as word lines, and metallic bit lines (not shown in the figure) are located above and perpendicular to the control gates 20. A drain region 22 and a common source region 26 are located on each side of the control gate 20. Furthermore, there is a contact window 23 above the drain region 22 for connecting electrically with the bit line. The common source region 26 is constructed from a buried metallic layer 28a and a surface source region 28b alternately linked together. Shallow trench isolation (STI) structures 24 are formed in the blank region between various devices. Processing operations necessary for forming the flash memory structure is explained in more detail below with reference to FIGS. 4A through 4E, FIGS. 5A through 5E and FIG. 6.

FIGS. 4A through 4E are cross-sectional views taken along line 4I—4I of FIG. 3 showing the progression of manufacturing steps for producing a flash memory structure. FIGS. 5A through 5E are cross-sectional views taken along line 5I—5I of FIG. 3, again showing the progression of manufacturing steps for producing a flash memory structure. FIG. 6 is a cross-sectional view taken along line 6I—6I of FIG. 3 showing a flash memory structure.

Figure 5A:
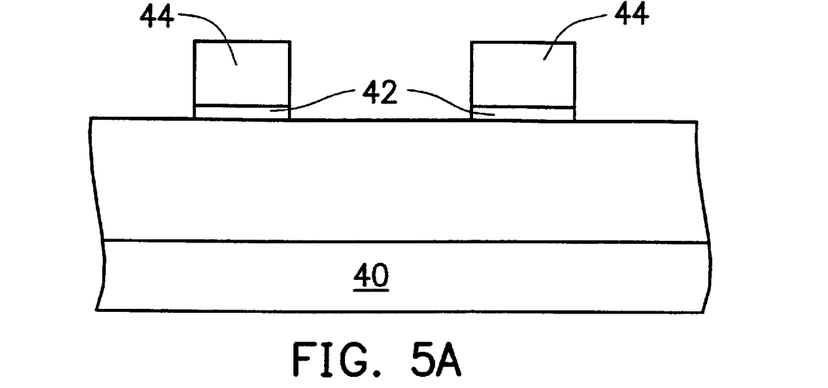
FIGS. 5A through 5E are cross-sectional views taken along line 5I—5I of FIG. 3 showing the progression of manufacturing steps for producing a flash memory structure.
Figure 6:
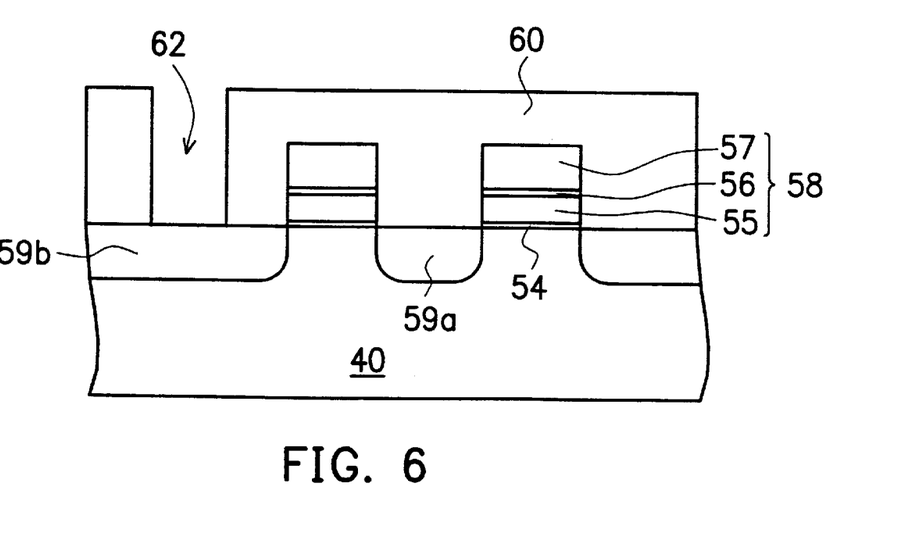
FIG. 6 is a cross-sectional view taken along line 6I—6I of FIG. 3 showing a complete flash memory structure.

First, as shown in FIG. 5A, a semiconductor substrate 40 is provided, and then a pad oxide layer 42 having a thickness of about 100 Å to 500 Å is formed over the substrate 40. Thereafter, a silicon nitride (SiN) layer 44 is formed over the pad oxide layer 42. The silicon nitride layer 44 preferably having a thickness of about 1000 Å to 3000 Å is formed using, for example, a chemical vapor deposition (CVD) method. In the subsequent step, photolithographic and anisotropic etching operations are carried out to pattern the silicon nitride layer 44 and the pad oxide layer 42.

Figure 4A:
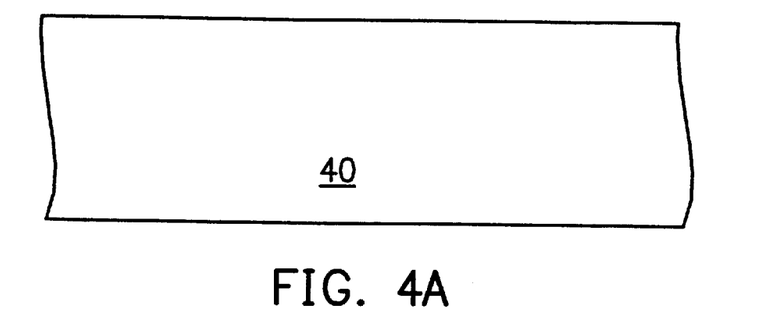
FIGS. 4A through 4E are cross-sectional views taken along line 4I—4I of FIG. 3 showing the progression of manufacturing steps for producing a flash memory structure.
Figure 4B:
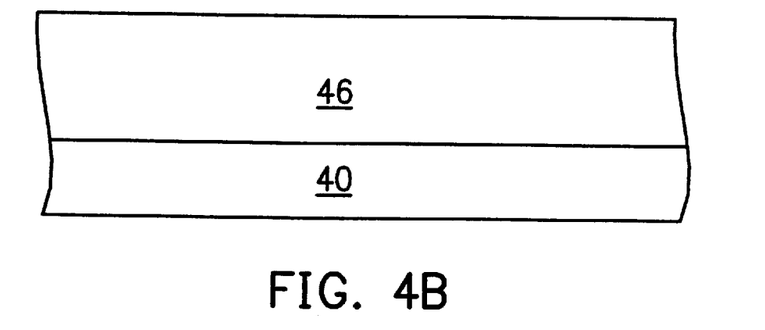
Figure 5B:
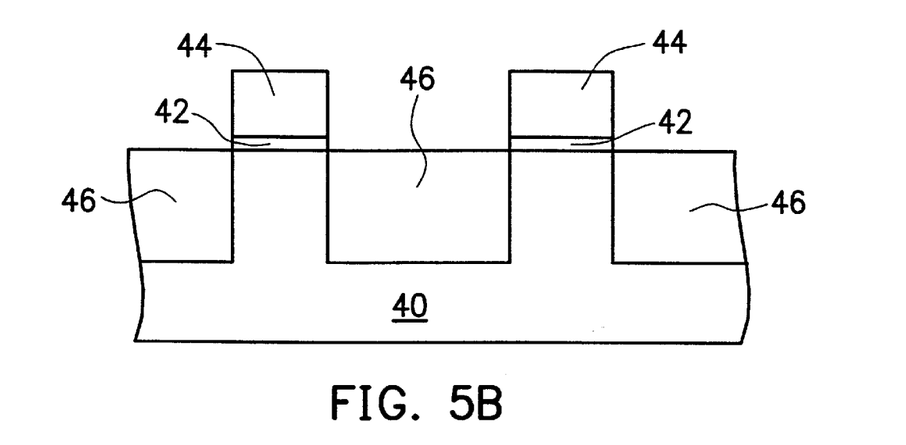

Next, as shown in FIGS. 4B and 5B, a portion of the semiconductor substrate 40 is etched using the silicon nitride layer 44 as a mask to form a trench. The semiconductor substrate 40 can be etched using, for example, an anisotropic etching method. Subsequently, an insulating material such as silicon dioxide is deposited into the trench, and then the layer of insulating material is polished to form a shallow trench isolation (STI) structure.

The layer of insulating material can be deposited using a chemical vapor deposition (CVD) method or an atmospheric pressure chemical vapor deposition (APCVD) method with tetra-ethyl-ortho-silicate (TEOS) as gaseous reagent. The insulating material can be polished using, for example, a chemical-mechanical polishing (CMP) method. Ultimately, the insulating layer will have a flat surface at the same height level as the upper surface of the substrate 40. The shallow trench structure 46 has a depth of roughly between 3000 Å to 10000 Å serving mainly to insulate devices and marking out the active region above the substrate 40.

Figure 4C:
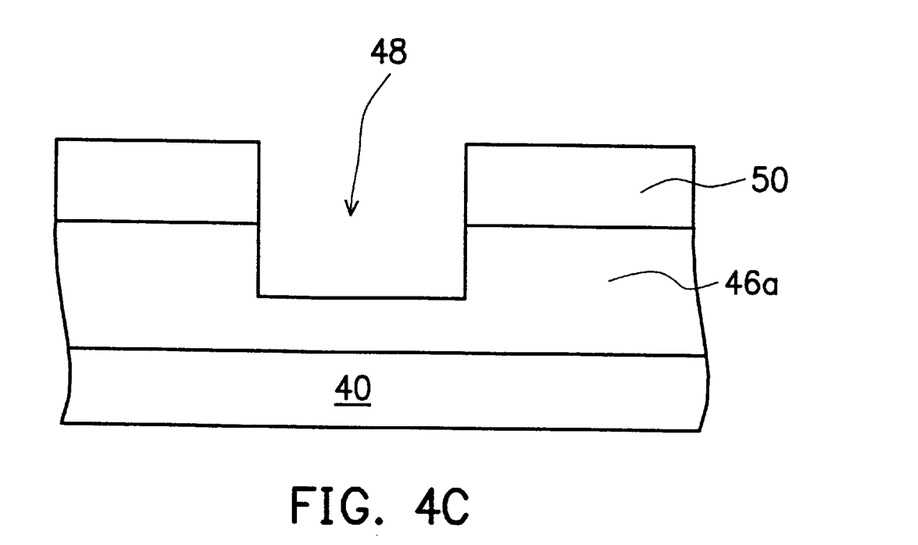
Figure 5C:
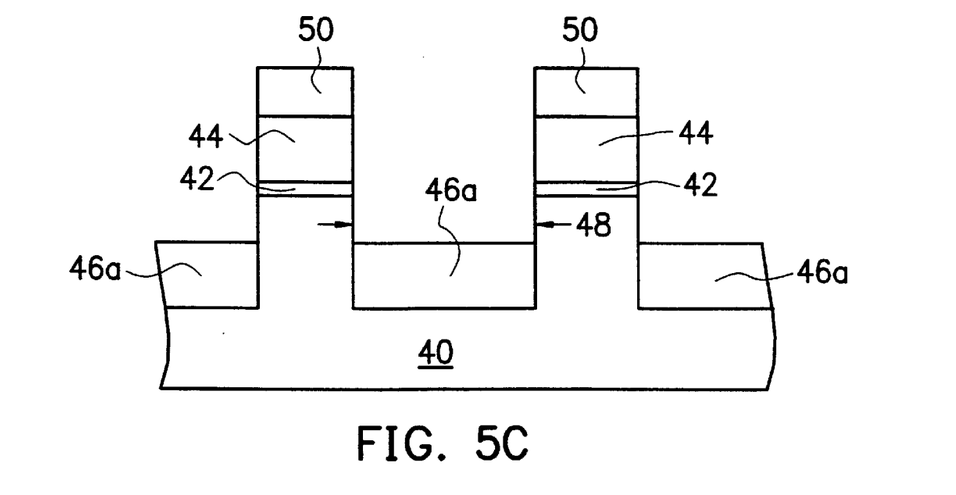

Next, as shown in FIGS. 4C and 5C, a photolithographic operation is carried out to form source masks 50 over the silicon nitride layer 44 and the semiconductor substrate 40. Subsequently, the source masks 50 are used to carry out an anisotropic etching operation. Consequently, a portion of the shallow trench structure 46 is etched to form another shallow trench 48 in regions where the common source terminals are desired. Note that the trench 48, preferably having a depth of about 1000 Å to 3000 Å, has a depth shallower than the shallow trench structure 46. Moreover, only a portion of the trench 48 and the shallow trench structure 46 overlap. The shallow trench structure 46 now becomes a shallow trench structure 46a. Thereafter, the source masks 50 are removed.

Figure 4D:
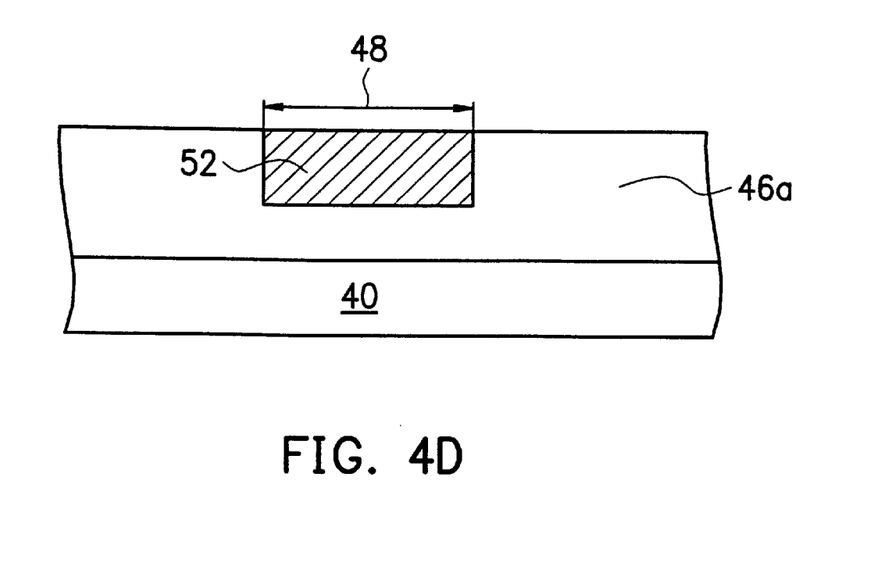
Figure 5D:
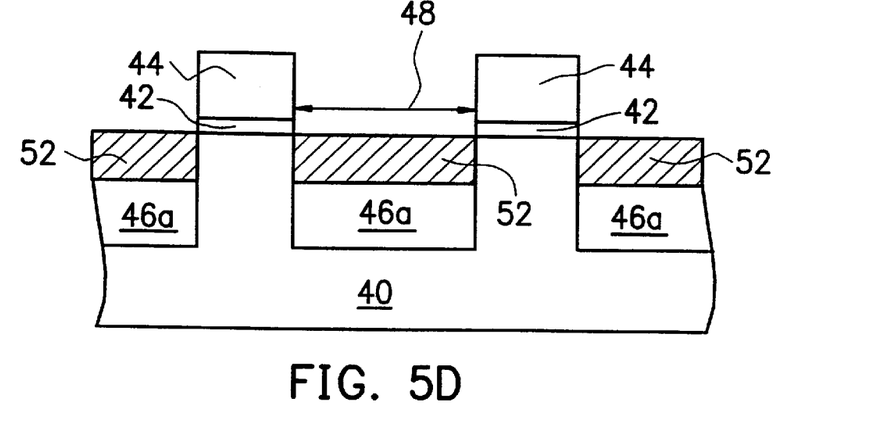

Next, as shown in FIGS. 4D and 5D, a buried metallic layer 52 is formed inside the trench 48. The buried metallic layer 52 is formed by first depositing conductive material, for example, tungsten or tungsten silicide ($WSi_2$), into the trench 48. Then, the tungsten layer is polished using, for example, a chemical-mechanical polishing (CMP) method until the metallic surface is flat and roughly at the same height level as the upper surface of the substrate 40. This buried metallic layer 52 is one major aspect of this invention capable of reducing area occupied by each device.

Figure 4E:
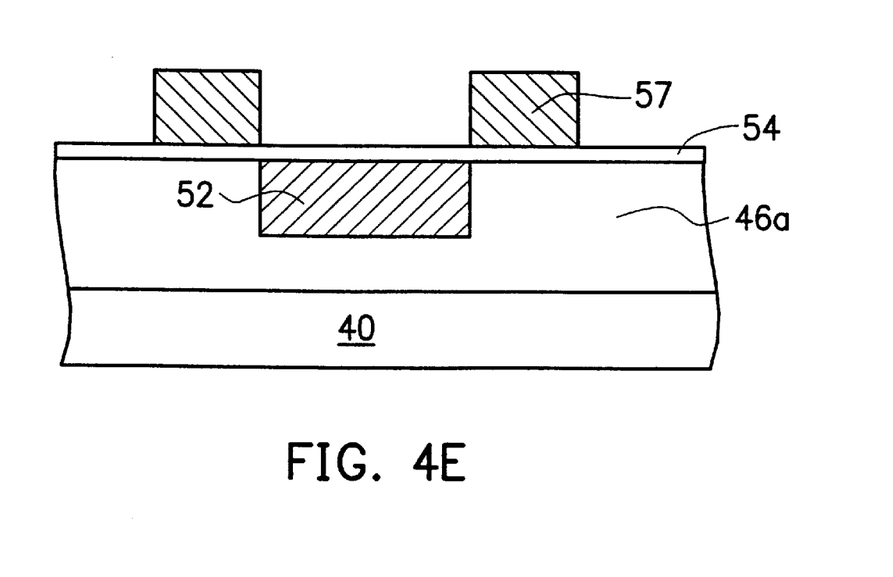
Figure 5E:
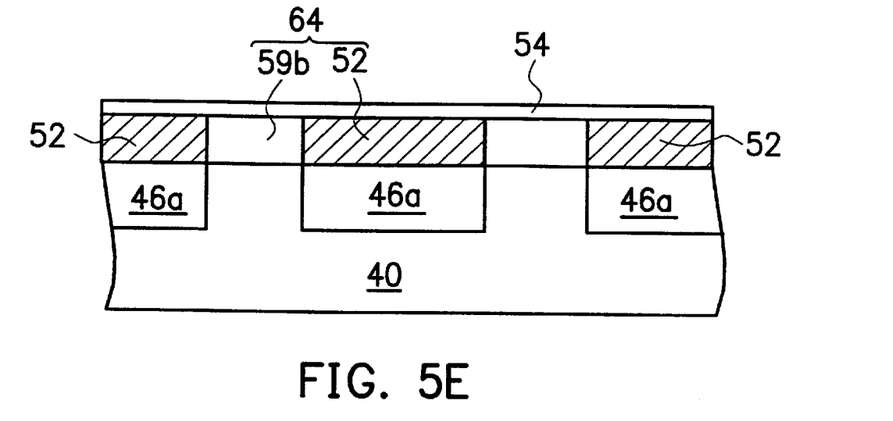

Next, as shown in FIGS. 4E and 5E, the pad oxide layer 42 and the silicon nitride layer 44 are removed. After that, a gate oxide layer 54, a first polysilicon layer 55 and a thin dielectric layer 56 (as shown in FIG. 6) are formed in sequence over the semiconductor substrate 40. Next, the gate oxide layer 54, the first polysilicon layer 55 and the dielectric layer 56 are patterned. Preferably, the dielectric layer 56 is an oxide/nitride/oxide (ONO) composite layer.

Subsequently, a second polysilicon layer 57 is formed over the dielectric layer 56 and the substrate 40, and then a photolithographic operation is carried out to form a pattern in the second polysilicon layer 57. Here, the second polysilicon layer 57 has a linear structure when viewed from the top (as shown in FIG. 3) and runs across the substrate above the first polysilicon layer 55. The first polysilicon layer 55 (acting as a floating gate), the dielectric layer 56 and the second polysilicon layer 57 (acting as a control gate) together constitute a stacked gate structure 58.

Since there is a gate oxide layer 54 in between the buried metallic layer 52 and the second polysilicon layer 57, coupling between the buried metallic layer 52 and the second polysilicon layer 57 is reduced considerably. Hence, although there might be some minor overlapping between the buried metallic layer 52 and the second polysilicon layer 57 above, reliability of the device can be maintained.

Next, as shown in FIGS. 4E and 5E, ions are implanted into the substrate 40 on each side of the second polysilicon layer 57 using the second polysilicon 57 itself as a mask. Consequently, a source region 59b and a drain region 59a (as shown in FIG. 6) are formed on each side of the second polysilicon layer 57. For example, arsenic or phosphorus ions can be implanted with a dosage level of about $10^5$ atoms/cm$^3$. The source region 59b will connect with the buried metallic layer 52 to form a buried common source 64.

Finally, an insulating layer 60 is formed over the second polysilicon layer 57, and then the insulating layer 60 is etched to form a contact window 62 that exposes the source region 59b. The contact window 62 is used for connecting with subsequently formed interconnect structures. Therefore, a flash memory structure fabricated according to this invention is complete.

FIG. 6 is a cross-sectional view along line 6I—6I of FIG. 3 showing a complete flash memory structure. As shown in FIG. 6, the gate oxide layer 54, the first polysilicon layer 55, the thin dielectric layer 56 and the second polysilicon layer 57 are formed above the semiconductor substrate 40. The first polysilicon layer 55 (acting as a floating gate), the thin dielectric layer 56 and the second polysilicon layer 57 (acting as a control gate) together form a stacked gate 58. In addition, the drain region 59a and the source region 59b are formed in the substrate 40 on each side of the stacked gate 58. Finally, a contact window 62 that exposes a portion of the source region 59b is also formed within the insulating layer 60.

In summary, the flash memory structure and its method of manufacture has advantages including:

1. The buried metallic layer 52 and the shallow trench isolation (STI) structure can be conveniently processed together. Moreover, misalignment problems can be prevented.
2. The buried metallic layer 52 is capable of considerably reducing unwanted coupling between the second polysilicon layer 57 and the buried metallic layer 52, even though there may be some slight overlapping between the two. Consequently, reliability of the device can be maintained.
3. The flash memory structure of this invention can reduce area occupied by each device even further.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device on a semiconductor substrate that has a buried metallic layer, comprising:

a polysilicon layer across the top of the semiconductor substrate;

a drain region in the semiconductor substrate on one side of the polysilicon layer;

a trench isolation structure in the semiconductor substrate for insulating from neighboring devices;

a buried metallic layer in the semiconductor substrate such that the buried metallic layer is located within a portion of the trench isolation structure close to the upper surface of the substrate;

a common source region within the semiconductor substrate, wherein the common source region is located on the other side of the first polysilicon layer just opposite the drain region such that the common source region at least includes a source region and a buried metallic layer alternately linked together; and an interconnect structure above the polysilicon layer and the trench isolation structure, wherein the interconnect structure is coupled electrically with the common source region through a contact window.

2. The structure of claim 1, wherein depth of the buried metallic layer is smaller than the depth of the trench isolation structure.

3. The structure of claim 1, wherein the drain region is formed by implanting arsenic or phosphorus ions with a dosage level of about $10^{15}$ atoms/cm$^3$.

4. The structure of claim 1, wherein the source region is formed by implanting arsenic or phosphorus ions with a dosage level of about $10^{15}$ atoms/cm$^3$.

5. The structure of claim 1, wherein the material deposited within the trench isolation structure includes silicon dioxide.

6. The structure of claim 1, wherein the material deposited to form the buried metallic layer includes tungsten.

7. A flash memory structure on a semiconductor substrate, comprising:

a first polysilicon layer above the semiconductor substrate;

a thin dielectric layer above the first polysilicon layer;

a second polysilicon layer across and above the dielectric layer and the substrate, wherein the second polysilicon layer has a linear shape when viewed from the top, and the first polysilicon layer, the dielectric layer and the second polysilicon layer together constitute a stacked gate structure;

a drain region in the semiconductor substrate on one side of the second polysilicon layer;

a trench isolation structure in the semiconductor substrate for insulating from neighboring devices;

a buried metallic layer within the semiconductor substrate, wherein the buried metallic layer is located inside a portion of the trench isolation structure close to the upper surface of the substrate; and a common source region within the semiconductor substrate, wherein the common source region is located on the other side of the first polysilicon layer just opposite the drain region such that the common source region at least includes a source region and a buried metallic layer alternately linked together.

8. The structure of claim 7, wherein depth of the buried metallic layer is smaller than the depth of the trench isolation structure.

9. The structure of claim 7, wherein the drain region is formed by implanting arsenic or phosphorus ions with a dosage level of about $10^{15}$ atoms/cm$^3$.

10. The structure of claim 7, wherein the source region is formed by implanting arsenic or phosphorus ions with a dosage level of about $10^{15}$ atoms/cm$^3$.

11. The structure of claim 7, wherein the material deposited to form the trench isolation structure includes silicon dioxide.

12. The structure of claim 7, wherein the material deposited to form the buried metallic layer includes tungsten.

* * * * *